(12) United States Patent
Fan

(10) Patent No.: US 8,281,940 B2
(45) Date of Patent: Oct. 9, 2012

(54) COMPUTER RACK

(75) Inventor: Chen-Lu Fan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 46 days.

(21) Appl. No.: 12/955,931

(22) Filed: Nov. 30, 2010

(65) Prior Publication Data

US 2012/0007478 A1 Jan. 12, 2012

(30) Foreign Application Priority Data

Jul. 9, 2010 (CN) .......................... 2010 1 0221679

(51) Int. Cl.
*A47F 7/00* (2006.01)
*A47B 47/02* (2006.01)

(52) U.S. Cl. ...................................... 211/26; 312/265.4

(58) Field of Classification Search ............... 312/257.1, 312/265.1, 265.4, 223.2, 334.4, 140, 265.2, 312/265.3, 223.1; 211/26, 175, 189; 174/100; 248/68.1, 49
See application file for complete search history.

(56) References Cited

U.S. PATENT DOCUMENTS

| | | | | |
|---|---|---|---|---|
| 3,199,464 A * | 8/1965 | Shook | ............................ | 211/175 |
| 4,014,435 A * | 3/1977 | Rowley et al. | ................ | 206/386 |
| 4,468,067 A * | 8/1984 | Jenkins | ........................ | 312/140 |
| 4,715,502 A * | 12/1987 | Salmon | ........................... | 211/26 |
| 4,720,016 A * | 1/1988 | Kay | ................................. | 211/96 |
| 4,974,377 A * | 12/1990 | Dominitz et al. | ............... | 52/143 |
| 5,078,461 A * | 1/1992 | Beck et al. | ..................... | 312/331 |
| 5,542,549 A * | 8/1996 | Siemon et al. | ................... | 211/26 |
| 6,019,446 A * | 2/2000 | Laboch et al. | ............. | 312/265.1 |
| 6,021,909 A * | 2/2000 | Tang et al. | ..................... | 211/183 |
| 6,190,081 B1 * | 2/2001 | Besserer et al. | ............. | 403/231 |
| 6,286,692 B1 * | 9/2001 | Hemping | ...................... | 211/169 |
| 6,655,533 B2 * | 12/2003 | Guebre-Tsadik | ............... | 211/26 |
| 6,736,277 B2 * | 5/2004 | Lauchner et al. | ............... | 211/26 |
| 6,974,037 B2 * | 12/2005 | Haney | .............................. | 211/26 |
| 7,293,666 B2 * | 11/2007 | Mattlin et al. | ................. | 211/189 |
| 7,316,379 B1 * | 1/2008 | Graham | ..................... | 248/298.1 |
| 7,592,542 B1 * | 9/2009 | Gerardo | .......................... | 174/58 |
| 8,083,298 B2 * | 12/2011 | Henderson et al. | ......... | 312/223.1 |
| 8,146,755 B2 * | 4/2012 | Schwartzkopf et al. | ...... | 211/103 |
| 8,203,854 B2 * | 6/2012 | Tsai et al. | ..................... | 361/829 |
| 2002/0046979 A1 * | 4/2002 | Larsen et al. | ................... | 211/26 |
| 2003/0034717 A1 * | 2/2003 | Yao | .............................. | 312/223.1 |
| 2004/0189161 A1 * | 9/2004 | Davis et al. | ................. | 312/265.3 |
| 2004/0189162 A1 * | 9/2004 | Davis et al. | ................. | 312/265.3 |
| 2004/0217073 A1 * | 11/2004 | Dobler et al. | ................... | 211/26 |
| 2005/0259383 A1 * | 11/2005 | Ewing et al. | .................. | 361/622 |
| 2007/0251904 A1 * | 11/2007 | Winig et al. | ............. | 211/106.01 |

(Continued)

*Primary Examiner* — James O Hansen
*Assistant Examiner* — Hiwot Tefera
(74) *Attorney, Agent, or Firm* — Altis Law Group, Inc.

(57) ABSTRACT

A computer rack includes an upper frame, a lower frame, two pairs of support legs, a pair of horizontal struts, a pair of mounting members, and a pair of vertical struts. The two pairs of support legs connect between the upper frame and the lower frame. The pair of horizontal struts is attached to the two pairs of the support legs at opposite sides. The pair of mounting members can be attached to each of the pair of horizontal struts at various horizontal locations. The pair of vertical struts is attached to the pair of mounting members. A distance between the pair of vertical struts varies when the locations of the pair of mounting members vary, thereby computer modules with different sizes capable of being mounted between the pair of vertical struts.

10 Claims, 4 Drawing Sheets

U.S. PATENT DOCUMENTS

2008/0198536 A1* 8/2008 Ewing et al. .................. 361/622
2010/0110621 A1* 5/2010 Dunn et al. .............. 361/679.01
2011/0304244 A1* 12/2011 Cottuli et al. .............. 312/223.1

* cited by examiner

COMPUTER RACK

BACKGROUND

1. Technical Field

The present disclosure relates to computer racks, more particularly to a computer rack capable of accommodating computer modules with different sizes.

2. Description of Related Art

It is important to provide high reliability and high capacity of operation for computing systems. Computer systems, such as blade server systems are typically rack mountable, with each processor occupying a frame in the rack. The trend in recent times is to accommodate more computer modules in a computer rack. The typical computer rack includes a frame, plural pairs of horizontal struts attached to the frame, and plural pairs of vertical struts perpendicularly attached to the horizontal struts. Each computer module (e.g., a blade of a server system) can be attached between the vertical struts. However, the distance between each pair of vertical struts is invariable, and the typical computer rack cannot accommodate computer modules with different sizes.

Therefore, there is room for improvement within this art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
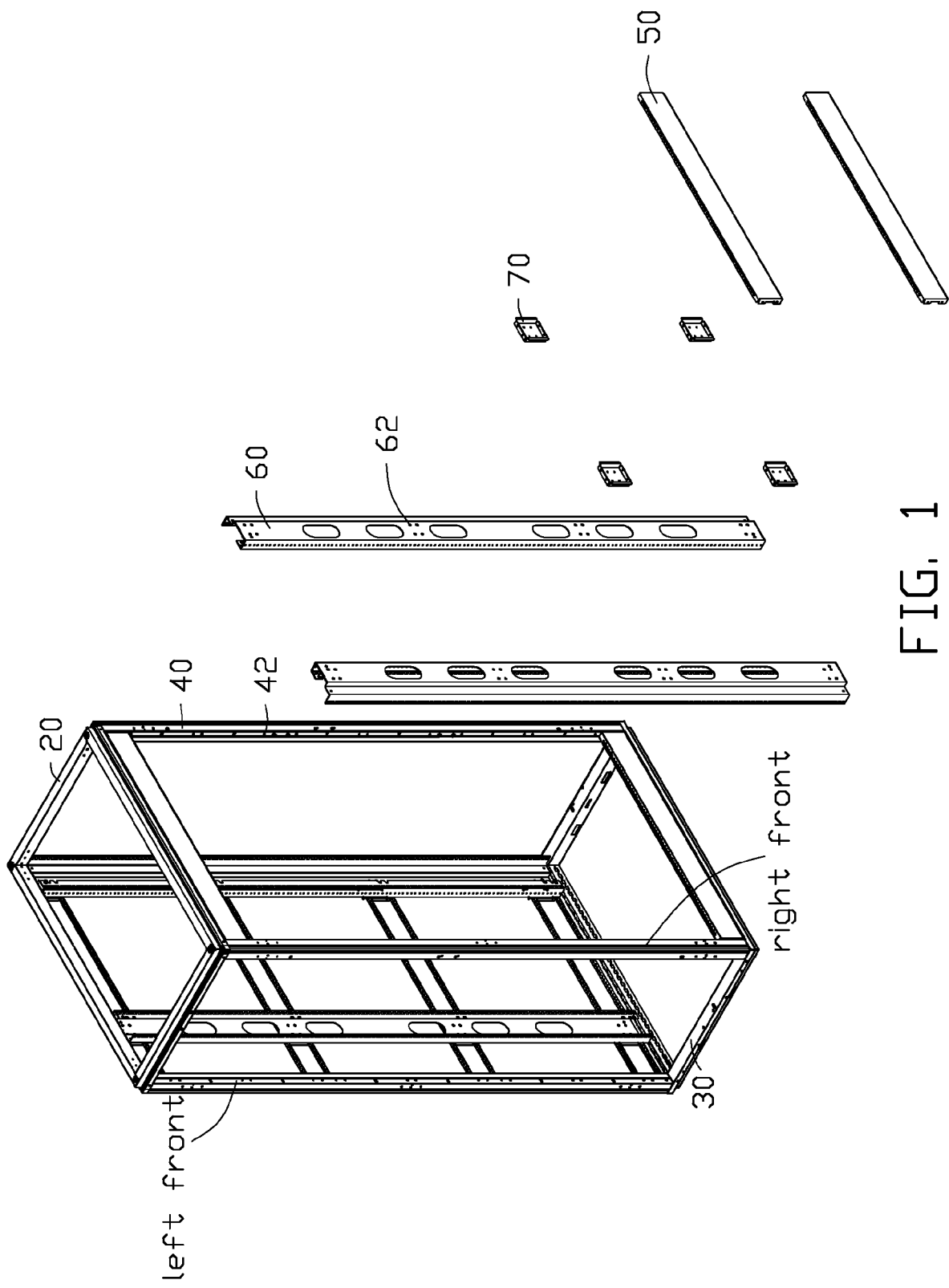
FIG. 1 is an isometric and partially exploded view of a computer rack in accordance with an embodiment.
Figure 2:
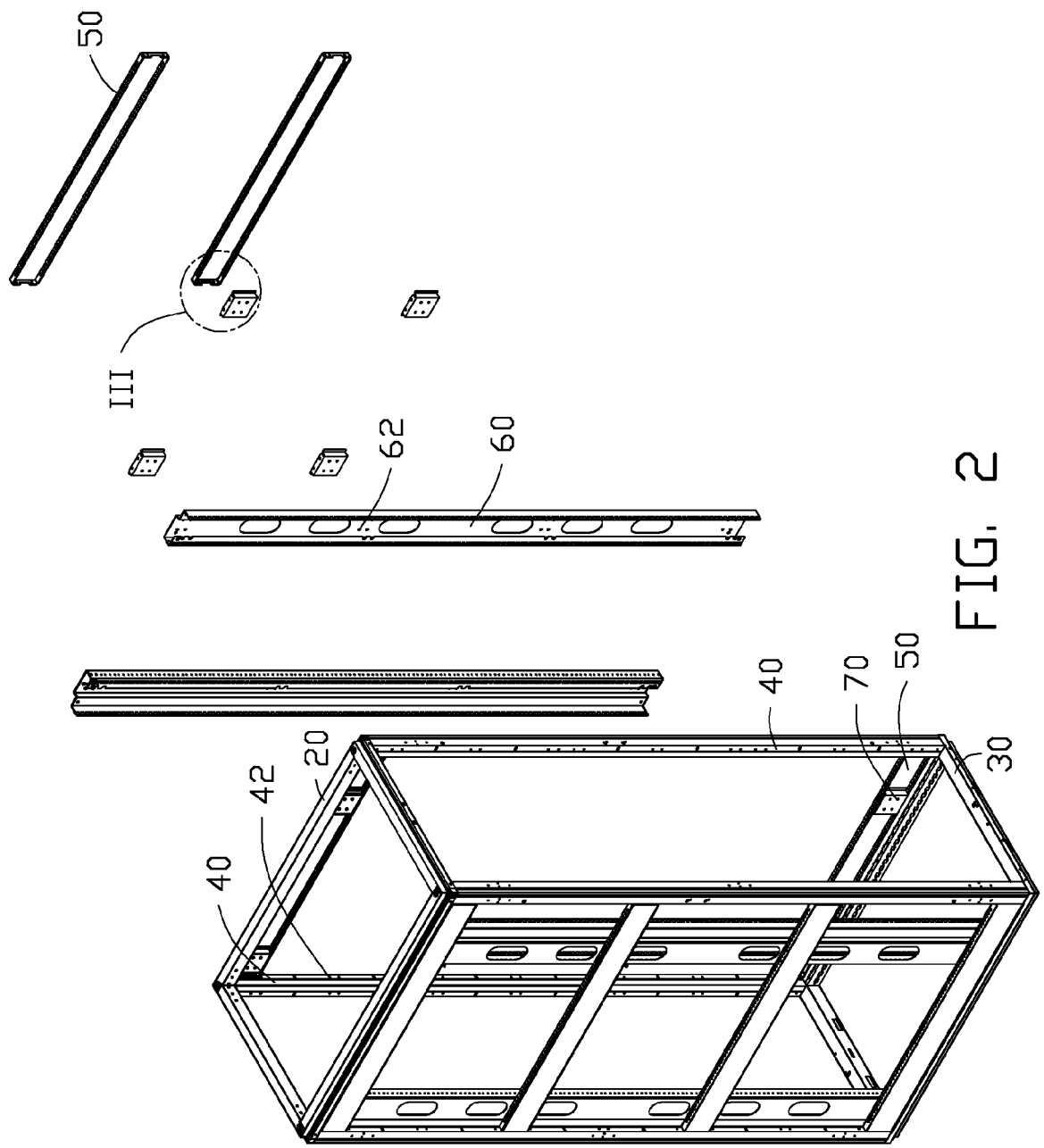
FIG. 2 is similar to FIG. 1, but viewed from another aspect.

Referring to FIGS. 1 and 2, an embodiment of a computer rack includes an upper frame 20, a lower frame 30, four support legs 40 connected between the upper frame 20 and the lower frame 30, multiple pairs of horizontal struts 50, two pairs of vertical struts 60, and multiple pairs of mounting members 70. Each of the upper frame 20 and the lower frame 30 comprises four horizontal beams which forms a rectangular shape. The support legs 40 are connected to four corners of each of the upper frame 20 and the lower frame 30. A plurality of screw holes 42 is defined in each of the support legs 40 at different vertical locations.

Figure 3:
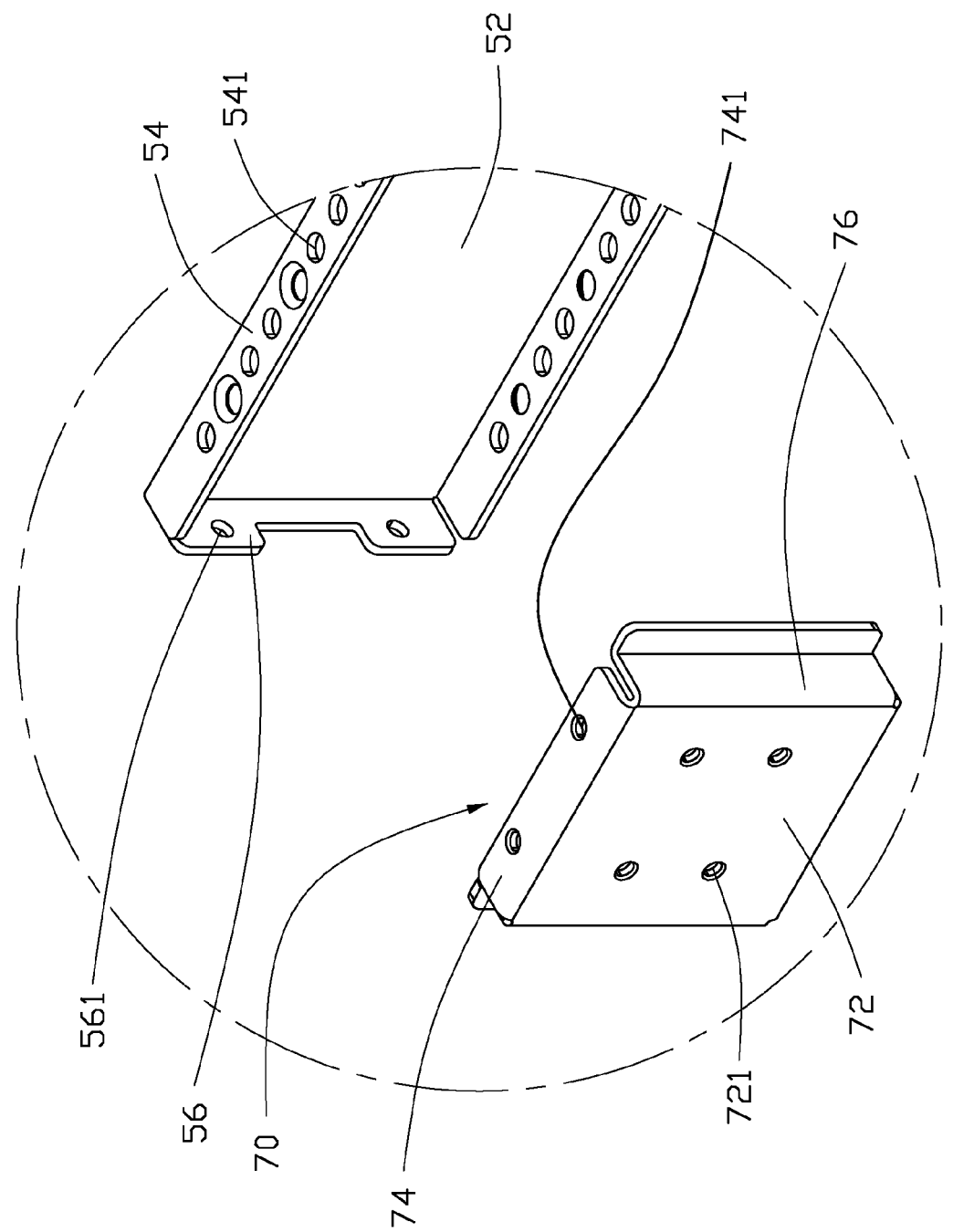
FIG. 3 is an enlarged view of the circled portion III of FIG. 2.

Referring to FIG. 3, each of the horizontal struts 50 includes a lengthways main body 52, a pair of securing flanges 54, and a pair of fixing pieces 56. The pair of securing flanges extends perpendicularly from upper and lower edges of the lengthways main body 52. The pair of fixing pieces 56 extends perpendicularly from two distal ends of the lengthways main body 52. A plurality of securing holes 541 is uniformly defined in each of the securing flanges 54 at different horizontal locations. A pair of circular holes 561 is defined in each of the fixing pieces 56. A length of each of the horizontal struts 50 is substantially equal to a distance between two support legs 40. Thus, each of the horizontal struts 50 can be secured between two support legs 40 at the left or right side.

Each of the mounting members 70 includes a square plate 72, a pair of fixing flanges 74 extending perpendicularly from upper and lower edges of the square plate 72, and a pair of L-shaped flanges 76 extending from opposite side edges of the square plate 72. A pair of fixing holes 741 is defined in each of the fixing flanges 74. The fixing holes 741 of each of the mounting members 70 can align with two of the securing holes 541 of each of the horizontal struts 50 at different horizontal locations. Four mounting holes 721 are defined in the square plate 72 for mounting the vertical strut 60. A width of the square plate 72 of each of the mounting members 70 is substantially equal to the width of the lengthways main body 52 of each of the horizontal struts 50.

Figure 4:
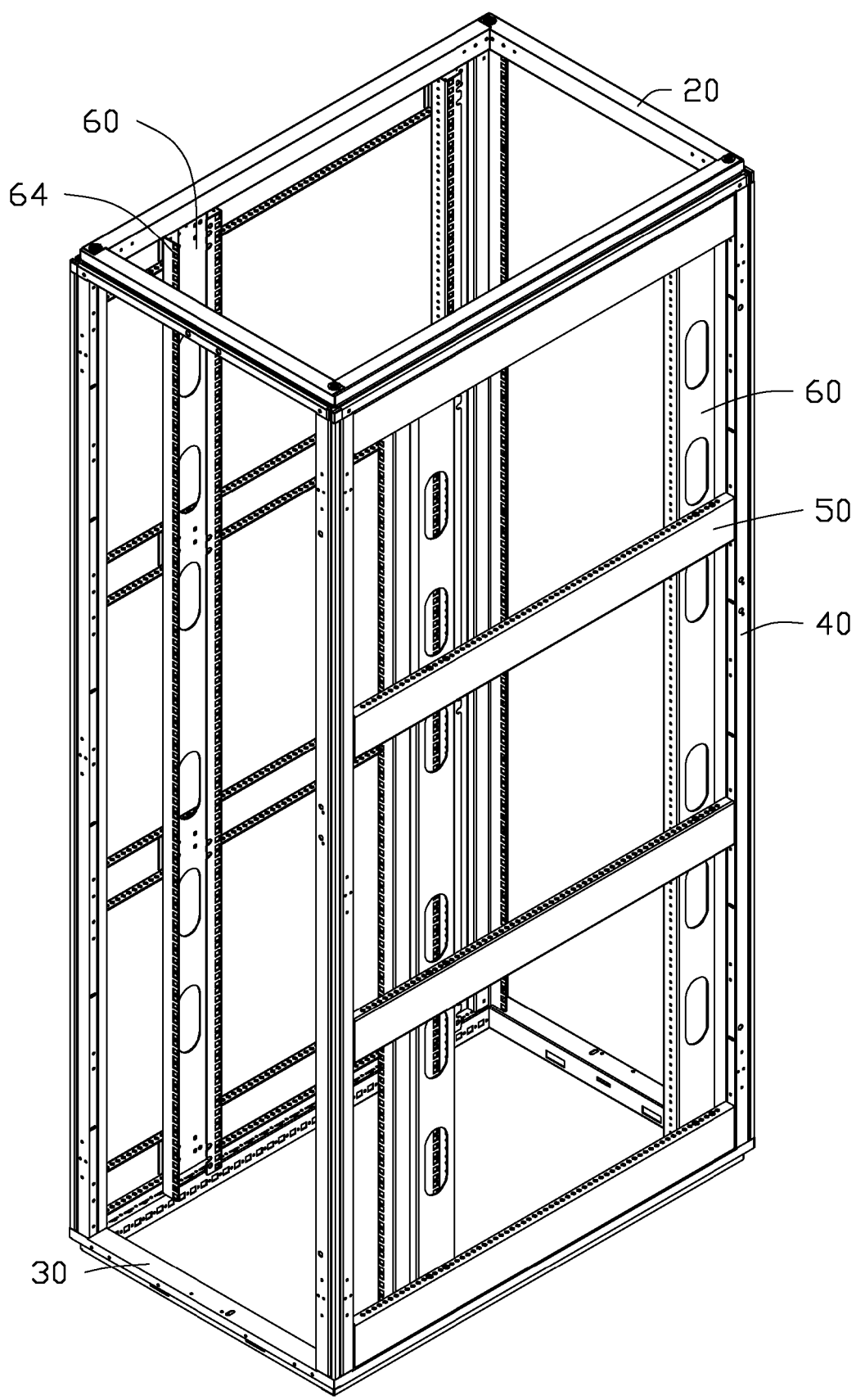
FIG. 4 is an assembled view of the computer rack of FIG. 1.

Referring to FIG. 4, in assembly, the fixing pieces 56 of each of the horizontal struts 50 abuts two support legs 40 at the left or right side of the computer module housing. The circular holes 561 of each of the fixing pieces 56 are aligned with two screw holes 42 of one of the support legs 40 at a desired height. Screws (not shown) are inserted into the circular holes 561 of each of the horizontal struts 50 and the selected screw holes 42 of the support legs 40 to securely attach each of the horizontal struts 50 between one pair of the support legs 40 at the desired height. One pair of mounting members 70 is mounted at an inner side of the lengthways main body 52 of each of the horizontal struts 50. The fixing holes 741 of each of the mounting members 70 align with selected securing holes 541 of each of the horizontal struts 50. Screws (not shown) are inserted into the securing holes 541 of the mounting members 70 and the fixing holes 741 of the horizontal struts 50 for securing the mounting members 70 to the horizontal struts 50 at the desired horizontal location. The L-shaped flanges 76 of the mounting members 70 can be secured to the surfaces of the horizontal struts 50 by welding to further secure the mounting members 70. Each of the vertical struts 60 is attached to two (an upper one and a lower one) mounting members 70 at the left or the right side. Screws (not shown) are inserted into holes 62 defined in each of the vertical struts 60 and the mounting holes 721 of the corresponding mounting members 70 to secure the vertical strut 60 to the corresponding mounting members 70.

In one embodiment, computer modules (e.g., blades of a server system) can be attached between the pair of vertical struts 60 at the left or right side. A distance between the pair of mounting members 70 attached to each of the horizontal struts 50 can vary, and a distance between the pair of vertical struts 60 at the left or right side consequently varies. Thus, the computer rack of the present disclosure can accommodate computer modules with different sizes and hold the computer modules at different heights.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A computer rack comprising:
an upper frame;
a lower frame;
two pairs of support legs connecting the upper frame and the lower frame;
a pair of horizontal struts attached to each of the two pairs of support legs; each of the pair of horizontal struts comprises a lengthways main body and a securing flange extending from the lengthways main body;
a pair of mounting members capable of being attached to each of the pair of horizontal struts at various horizontal locations; each of the pair of mounting members comprising a square plate, a fixing flange extending from a first edge of the square plate, and a L-shaped flange extending from a second edge of the square plate, the second edge being substantially perpendicular to the first edge; and
a pair of vertical struts, each of the pair of vertical struts being attached to a respective pair of the horizontal struts via respective mounting members;
wherein the fixing flange abuts an inner surface of the securing flange, the L-shaped flange abuts an inner surface of the lengthways main body, a distance between the pair of vertical struts is adjustable according to a size of a computer module accommodated between the pair of vertical struts when the locations of the pair of mounting members are changed.

2. The computer rack of claim 1, wherein a plurality of securing holes is defined in the securing flange, and at least one fixing hole is defined in the fixing flange.

3. The computer rack of claim 2, wherein a plurality of screw holes is defined in each of the two pairs of support legs at different heights, each of the pair of horizontal struts further comprises a fixing piece extending perpendicularly from each distal end of the lengthways main body, a circular hole is defined in the fixing piece.

4. The computer rack of claim 2, wherein a width of the square plate is substantially equal to the width of the lengthways main body.

5. The computer rack of claim 1, wherein at least one mounting hole is defined in the square plate.

6. A computer rack comprising:
an upper frame;
a lower frame;
two pairs of support legs, connected between the upper frame and the lower frame, located at opposite sides; a pair of horizontal struts attached to each of the two pairs of support at various vertical locations legs, each of the pair of horizontal struts comprises a lengthways main body and a securing flange extending from the lengthways main body;
a pair of mounting members capable of being attached to each of the pair of horizontal struts at various horizontal locations; each of the pair of mounting members comprising a square plate, a fixing flange extending from a first edge of the square plate, and a L-shaped flange extending from a second edge of the square plate, the second edge being substantially perpendicular to the first edge; and
a pair of vertical struts, each of the pair of vertical struts being attached to a respective pair of the horizontal struts via respective mounting members and configured to hold computer modules therebetween;
wherein the fixing flange abuts an inner surface of the securing flange, and the L-shaped flange abuts an inner surface of the lengthways main body.

7. The computer rack of claim 6, wherein a plurality of securing holes is uniformly defined in the securing flange, and at least one fixing hole is defined in the fixing flange and capable of cooperating with a selected one of the plurality of securing holes.

8. The computer rack of claim 7, wherein a plurality of screw holes is defined in each of the two pairs of support legs at different heights, each of the pair of horizontal struts further comprises a fixing piece extending perpendicularly from each distal end of the lengthways main body, a circular hole is defined in the fixing piece for cooperating with a selected one of the plurality screw holes at a desired height.

9. The computer rack of claim 7, wherein a width of the square plate is substantially equal to the width of the lengthways main body.

10. The computer rack of claim 6, wherein at least one mounting hole is defined in the square plate for securing one of the pair of vertical struts.

* * * * *